US007200830B2

(12) United States Patent
Drost et al.

(10) Patent No.: US 7,200,830 B2
(45) **Date of Patent: *Apr. 3, 2007**

(54) ENHANCED ELECTRICALLY-ALIGNED PROXIMITY COMMUNICATION

(75) Inventors: Robert J. Drost, Mountain View, CA (US); Ivan E. Sutherland, Santa Monica, CA (US); Ronald Ho, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 350 days.

This patent is subject to a terminal disclaimer.

(21) Appl. No.: 10/879,607

(22) Filed: Jun. 28, 2004

(65) Prior Publication Data

US 2005/0054139 A1 Mar. 10, 2005

Related U.S. Application Data

(60) Provisional application No. 60/500,661, filed on Sep. 5, 2003.

(51) Int. Cl.
*G06F 17/50* (2006.01)

(52) U.S. Cl. ................................ 716/12; 716/14; 716/1

(58) Field of Classification Search .................. 716/12, 716/14, 1
See application file for complete search history.

(56) References Cited

U.S. PATENT DOCUMENTS

| | | | | |
|---|---|---|---|---|
| 4,818,728 | A * | 4/1989 | Rai et al. | 438/108 |
| 5,523,628 | A * | 6/1996 | Williams et al. | 257/777 |
| 5,629,838 | A | 5/1997 | Knight et al. | 361/782 |
| 5,786,979 | A * | 7/1998 | Douglass | 361/328 |
| 6,500,696 | B2 * | 12/2002 | Sutherland | 438/109 |
| 6,600,325 | B2 * | 7/2003 | Coates et al. | 324/519 |
| 6,728,113 | B1 | 4/2004 | Knight et al. | 361/760 |
| 6,812,046 | B2 * | 11/2004 | Drost et al. | 438/14 |
| 6,916,719 | B1 | 7/2005 | Knight et al. | 438/381 |

* cited by examiner

*Primary Examiner*—Sun James Lin
(74) *Attorney, Agent, or Firm*—Park, Vaughan & Fleming, LLP

(57) ABSTRACT

One embodiment of the present invention provides a system that facilitates capacitive inter-chip communication. During operation, the system first determines an alignment between a first semiconductor die and a second semiconductor die. Next, electrical signals are selectively routed to at least one interconnect pad in a plurality of interconnect pads based on the alignment thereby facilitating communication between the first semiconductor die and the second semiconductor die. The plurality of interconnect pads can include transmitting pads, receiving pads, and transmitting and receiving pads. The alignment may be determined continuously or at times separated by an interval, where the interval is fixed or variable. Several variations on this embodiment are provided.

30 Claims, 9 Drawing Sheets

ENHANCED ELECTRICALLY-ALIGNED PROXIMITY COMMUNICATION

RELATED APPLICATION

This application hereby claims priority under 35 U.S.C. §119 to U.S. Provisional Patent Application No. 60/500,661 filed on 5 Sep. 2003, entitled "Enhanced Electrically Aligned Proximity Communication," by inventors Robert J. Drost, Ivan E. Sutherland and Ronald Ho.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for communicating signals between semiconductor dies. More specifically, the present invention relates to a method and an apparatus for communication between semiconductor dies by routing electrical signals based on alignment between the semiconductor dies.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to align the chips properly. It is possible to align the chips by assigning a charge to conducting plates on one chip, and detecting a specific pattern of charges that are induced in plates on a facing chip. An existing system improves upon this technique by providing a plurality of conductive elements on the first chip and a plurality of conductive elements on the second chip with a different spacing than the conductive elements on the first chip. When the conductive elements on the first chip overlap the conductive elements on the second chip a vernier is created, thereby allowing the alignment between the chips to be determined, thereby allowing the chips to be positioned so as to minimize misalignment problems.

This existing system, however, has limitations. Even with very careful mechanical assembly, the chips still have some residual misalignment. Misalignment can possibly cause each receiving pad to span two transmitting pads, thereby destroying a received signal. In theory, satisfactory communication requires alignment such that the residual misalignment is less than half of a pitch between the pads. In practice, the alignment requirements may be more stringent. Furthermore, thermal expansion and the effects of mechanical vibration may make it difficult to achieve and maintain such accurate alignment.

What is needed is a method and an apparatus to facilitate capacitive inter-chip communications without the problems listed above.

SUMMARY

One embodiment of the present invention provides a system that facilitates capacitive inter-chip communication. During operation, the system first determines an alignment between a first semiconductor die and a second semiconductor die. Next, electrical signals are selectively routed to at least one interconnect pad in a plurality of interconnect pads based on the alignment thereby facilitating communication between the first semiconductor die and the second semiconductor die. The plurality of interconnect pads can include transmitting pads, receiving pads, and transmitting and receiving pads. The alignment may be determined continuously or at times separated by an interval, where the interval is fixed or variable.

In a variation on this embodiment, the alignment is determined using a vernier that is formed when a plurality of conductive elements on the first semiconductor die overlap a plurality of conductive elements on the second semiconductor die with a different spacing than the conductive elements on the first semiconductor die. By selectively charging each of the plurality of conducting elements on the first semiconductor die, a charge in one or more of the conductive elements on the second semiconductor die is induced when the conductive element on the first semiconductor die overlaps one or more conductive elements on the second semiconductor die. The alignment is determined by amplifying and analyzing the signals induced on the conductive elements in the second semiconductor die.

In a further variation on this embodiment, the routing of the electrical signals involves using a multiplexer.

In another embodiment of the present invention, electrical signals are routed to at least one transmitting pad selected from more than one possible transmitting pad in a first array on the first semiconductor die using a routing mechanism internal to the first array, and then from at least one receiving pad selected from more than one possible receiving pad in a second array on the second semiconductor die using a routing mechanism internal to the second array.

In a variation on this embodiment, the routing mechanism internal to the first array and the routing mechanism internal to the second array include a barrel shifter.

In another variation on this embodiment, the system corrects for misalignment that is substantially less than half of a pitch in the first array, where the pitch is defined as the distance from a center of one transmitting pad to the center of a neighboring transmitting pad.

In a variation on this embodiment, the first semiconductor die includes a routing mechanism external to the first array, the second semiconductor die includes a routing mechanism external to the second array, or the first semiconductor die and the second semiconductor die include routing mechanisms external to the first array and the second array, respectively. In this variation, the routing mechanism external to the first array and the routing mechanism external to the second array include a multiplexer and facilitate the correction of coarse misalignment between the transmitting pads and the receiving pads, thereby facilitating capacitive inter-chip communication.

In another variation on this embodiment, a tiling mechanism spatially repeats the electrical signals on a plurality of inputs to the routing mechanism internal to the first array during at least one cycle of a clock generated by a timing mechanism, and thereby spatially repeats the electrical signals on a plurality of the transmitting pads in the first array. In yet another variation on this embodiment, a de-tiling mechanism converts spatially repeated electrical signals on a plurality of outputs from the routing mechanism internal to the second array, and thereby spatially repeated on a plurality of the receiving pads in the second array, into the electrical signals during at least one cycle of the clock.

Several additional variations on this embodiment are also provided.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Alignment Correction Using a Routing Mechanism Internal to an Array

Figure 1:
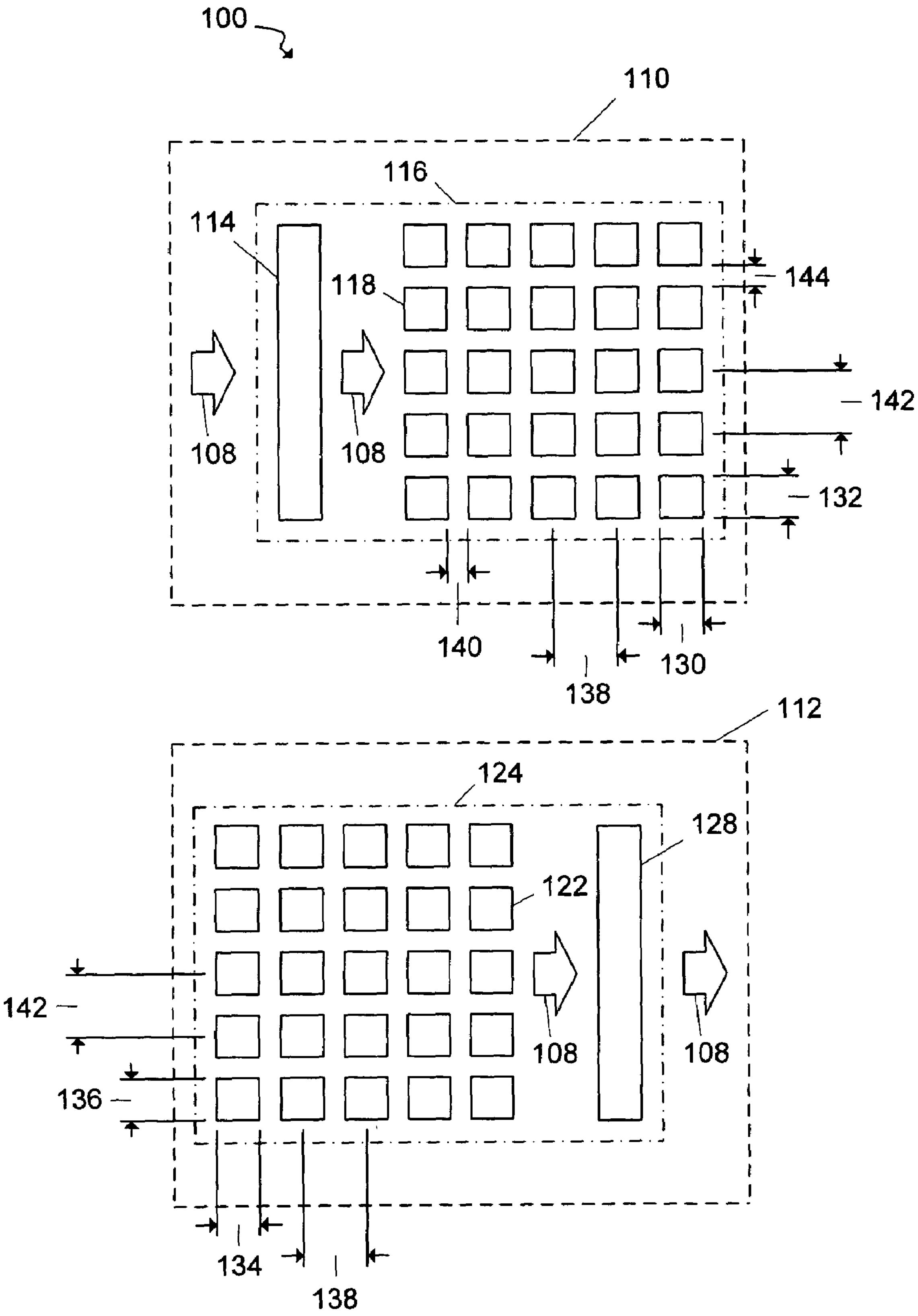
FIG. 1 illustrates a first semiconductor die with a routing mechanism internal to a first array of transmitting pads in communication with a second semiconductor die with a routing mechanism internal to a second array of receiving pads in an embodiment of this invention.

FIG. 1 illustrates an embodiment 100 of the present invention that facilitates capacitive communication of data 108 in the form of electrical signals between a first semiconductor die 110 and a second semiconductor die 112. A routing mechanism 114 internal to a first array 116 in the first semiconductor die 110 selectively routes electrical signals to at least one transmitting pad 118. Note that the first array 116 contains a plurality of transmitting pads. The electrical signals are capacitively coupled through these transmitting pads to at least one receiving pad 122 in a second array 124 in the second semiconductor die 112. Note that the second array 124 contains a plurality of receiving pads. The electrical signals are selectively routed from the receiving pad 122 using a routing mechanism 128 internal to the second array 124. Note that the transmitting pad 118 and the receiving pad 122 are selected based on the alignment of the first semiconductor die 110 and the second semiconductor die 112. In this way, a correction may be made for misalignment of the first semiconductor die 110 and the second semiconductor die 112 thereby facilitating capacitively coupled communication.

To facilitate high-bandwidth, low-latency capacitively coupled communication between the first semiconductor die 110 and the second semiconductor die 112, the routing mechanism 114 internal to the first array 116 and the routing mechanism 128 internal to the second array 124 can be pipelined such that the electrical signals are routed in parallel. In an embodiment of the present invention, the routing mechanism 114 internal to the first array 116 and the routing mechanism 128 internal to the second array 124 include a barrel shifter. Other routing mechanisms are possible, such as routing of electrical signals using matrixed addressing in the first array 116 and the second array 124 or addressing using a bus, such as I2C, with a look-up table.

The misalignment Dx in one dimension coplanar with a surface of the first semiconductor die 110 or the second semiconductor die 112 that may be corrected for using the routing mechanism 114 internal to the first array 116 and the routing mechanism 128 internal to the second array 124 is often limited. Similarly, the misalignment Dx and Dy in two orthogonal dimensions coplanar with the surface of the first semiconductor die 110 or the second semiconductor die 112 that may be corrected is also often limited. These limits are based on the allowable complexity internal to the first array 116 and the second array 124. Correcting for larger misalignment necessitates an increase in the number of wires in the first array 116 and the second array 124 and the number of leads connected to the first array 116 and the second array 124. Also note that additional complexity internal to the first array 116 and the second array 124 may increase a latency associated with routing the electrical signals, which is undesirable. Misalignment in two orthogonal dimensions is described below as an illustrative example.

In the present invention, with a transmitting pad width $W_{T1}$ 130 in a first direction, a transmitting pad width $W_{T2}$ 132 in a second direction, a receiving pad width $W_{R1}$ 134 in the first direction, a receiving pad width $W_{R2}$ 136 in the second direction, a first pitch 138 in the first array 116 (defined as a distance from a center of a transmitting pad to the center of a neighboring transmitting pad in the first direction), a second pitch 142 in the first array 116 (defined as a distance from a center of a transmitting pad to the center of a neighboring transmitting pad in the second direction), and the first pitch $P_1$ 138 and the second pitch $P_2$ 142 in the second array 124, correctable misalignment is determined by the first pitch $P_1$ 138 and the second pitch $P_2$ 142.

If the receiving pad width $W_{R1}$ 134 is less than the transmitting pad width $W_{T1}$ 130 and the receiving pad width $W_{R2}$ 136 is less than the transmitting pad width $W_{T2}$ 132, misalignment by half of the first pitch $P_1$ 138 or more or half of the second pitch $P_2$ 142 or more will result in a loss of the coupled electrical signals on the receiving pad 122. In this case, satisfactory communication thus requires alignment such that $|Dx| << 0.5P_1$ 138 and $|Dy| << 0.5P_2$ 142. Note that $0.5\ P_1$ 138 and $0.5P_2$ 142 are theoretical upper bounds. Detection thresholds and data rates in circuitry may result in stricter alignment criteria.

The pads in the first array 116, the second array 124, as well as in other embodiments of the present invention, may include so-called full-sized pads as well as so-called micropads. Full-sized pads have a larger ratio of a pad width to a pad pitch, for example, the transmitting pad width $W_{T1}$ 130 divided by first pitch 138 in the first direction in the first array 116. A spacing, such as guard band 140, between full-sized pads and the spacing between micropads may be the same, for example, 1 μm. The guard band 140 is the first pad pitch 138 minus the transmitting pad width $W_{T1}$ 130.

The choice of full-sized pads or micropads represents a tradeoff between capacitive communication signal strength, cross-talk and parasitic coupling. Full-sized pads may be used on both the first semiconductor die 110 and the second semiconductor die 112. Micropads may also be used on either the first semiconductor die 110 or the second semiconductor die 112. Alternatively, micropads may be used on both the first semiconductor die 110 and the second semiconductor die 112. Or combinations of full-sized pads and micropads may be used on the first semiconductor die 110, the second semiconductor die 112 or on both the first semiconductor die 110 and the second semiconductor die 112. In addition, a subsection of micropads in the first array 116 or the second array 124 may be connected as a group.

Alignment Correction Using a Routing Mechanism External to an Array

Figure 2:
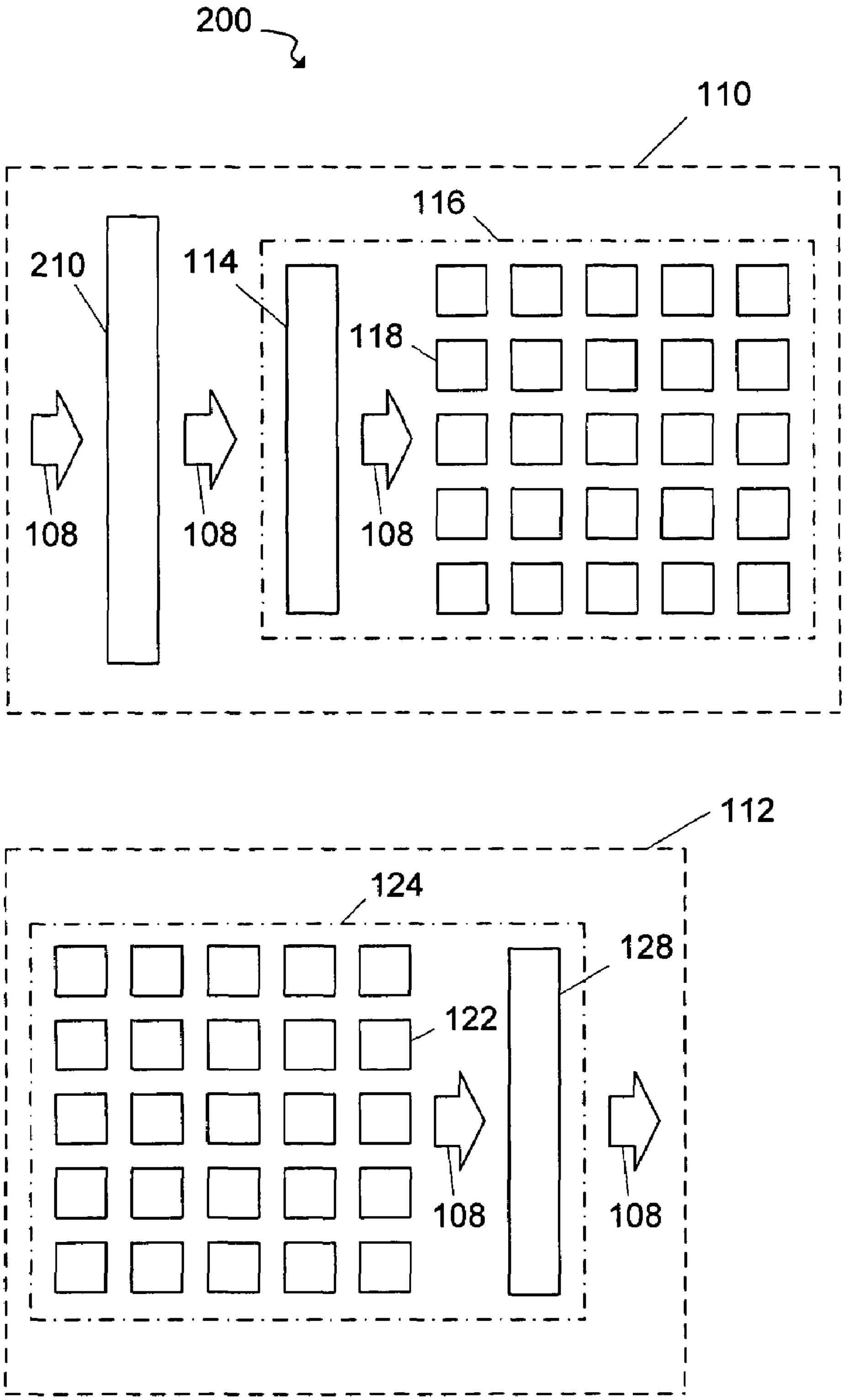
FIG. 2 illustrates the first semiconductor die with a routing mechanism external to the first array of transmitting pads in communication with the second semiconductor die with the second array of receiving pads in an embodiment of this invention.

FIG. 2 illustrates an embodiment 200 of the present invention that facilitates capacitive communication between a first semiconductor die 110 and a second semiconductor die 112 by correction of a more coarse misalignment. A routing mechanism 210 external to the first array 116 in the first semiconductor die 110 selectively routes electrical signals to the routing mechanism 114 internal to the first array 116, and thus to at least one transmitting pad 118. Note that FIG. 2, as well as the figures for other embodiments in the present invention, is illustrative only. Thus, the routing mechanism 114 internal to the first array 116 may be next to pads in the first array 116, integrated in a layer containing the pads or in a layer underneath the pads.

In a variation on this embodiment, the first array 116 is one dimensional and the routing mechanism 210 external to the first array 116 includes a multiplexer, having n inputs (not shown) to the multiplexer and m outputs (not shown) to the routing mechanism 114 internal to the first array 116, where $n \leqq m$. In this variation on this embodiment, the second array 124 has n outputs.

In another variation on this embodiment, the first array 116 has two orthogonal dimensions coplanar with the surface of the first semiconductor die 110 and the routing mechanism 210 external to the first array 116 includes a multiplexer, having n inputs (not shown) to the multiplexer and m outputs (not shown) to the routing mechanism 114 internal to the first array 116 corresponding to the first direction, and m outputs (not shown) to the routing mechanism 114 internal to the first array 116 corresponding to the second direction, where $n \leqq m$. In this variation on this embodiment, the second array 124 has n outputs.

Figure 3:
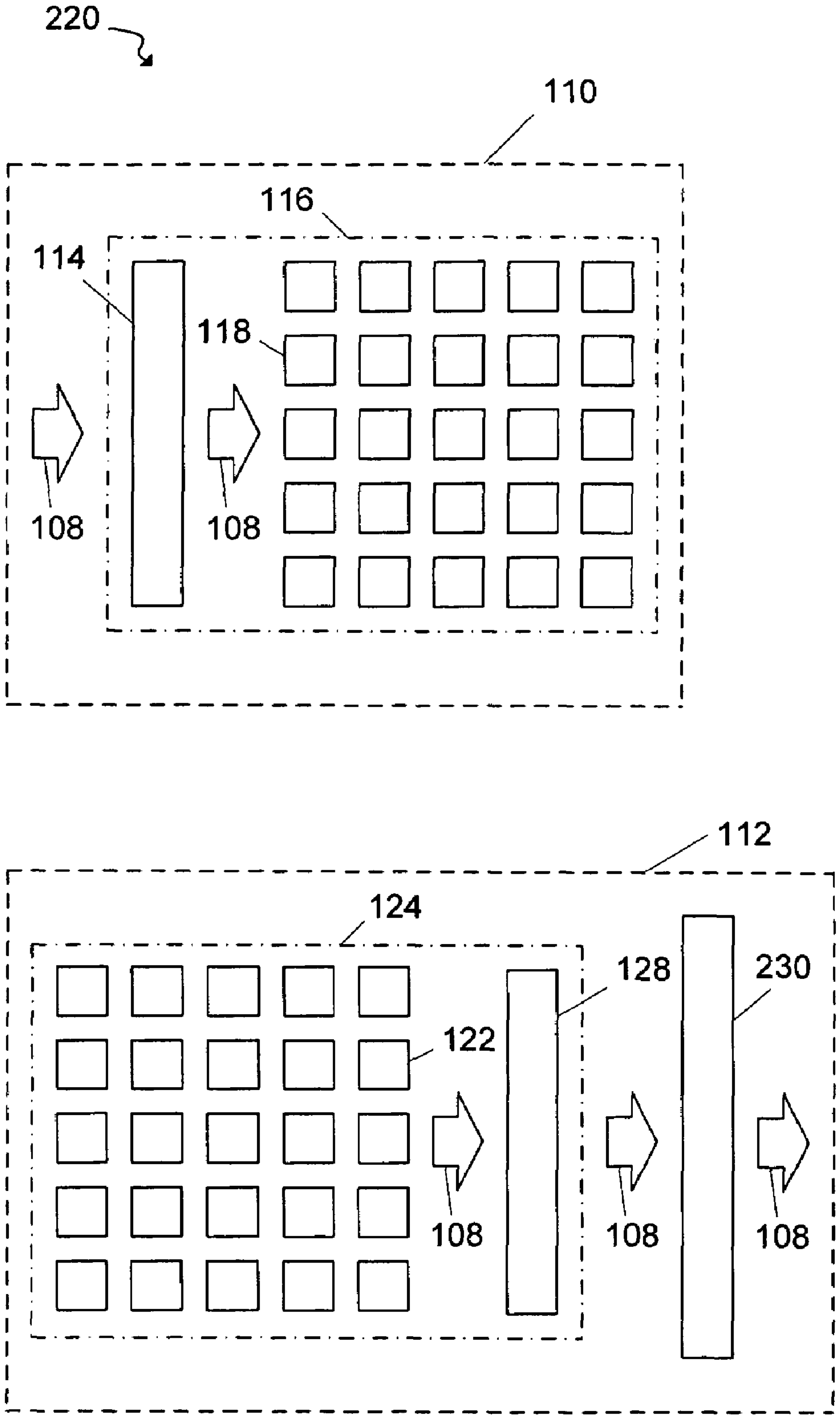
FIG. 3 illustrates the first semiconductor die with the first array of transmitting pads in communication with the second semiconductor die with a routing mechanism external to the second array of receiving pads in an embodiment of this invention.

FIG. 3 illustrates an embodiment 220 of the present invention that facilitates capacitive communication between a first semiconductor die 110 and a second semiconductor die 112 by correction of a more coarse misalignment. In this embodiment, routing mechanism 230 external to the second array 124 in the second semiconductor die 112 selectively routes electrical signals from the routing mechanism 128 internal to the second array 124, and thus from at least one receiving pad 122.

In a variation on this embodiment, the second array 124 is one dimensional and the routing mechanism 230 external to the second array 124 includes a multiplexer, having m inputs (not shown) to the multiplexer from the routing mechanism 128 internal to the second array 124 and n outputs (not shown), where $m \geqq n$. In this variation on this embodiment, the first array 116 has n inputs.

In another variation on this embodiment, the second array 124 has two orthogonal dimensions coplanar with the surface of the second semiconductor die 112 and the routing mechanism 230 external to the second array 124 includes a multiplexer, having m inputs (not shown) to the multiplexer from the routing mechanism 128 internal to the second array 124 corresponding to the first direction, m inputs (not shown) to the multiplexer from the routing mechanism 128 internal to the second array 124 corresponding to a second direction and n outputs (not shown), where $m \geqq n$. In this variation on this embodiment, the first array 116 has n inputs.

Figure 4:
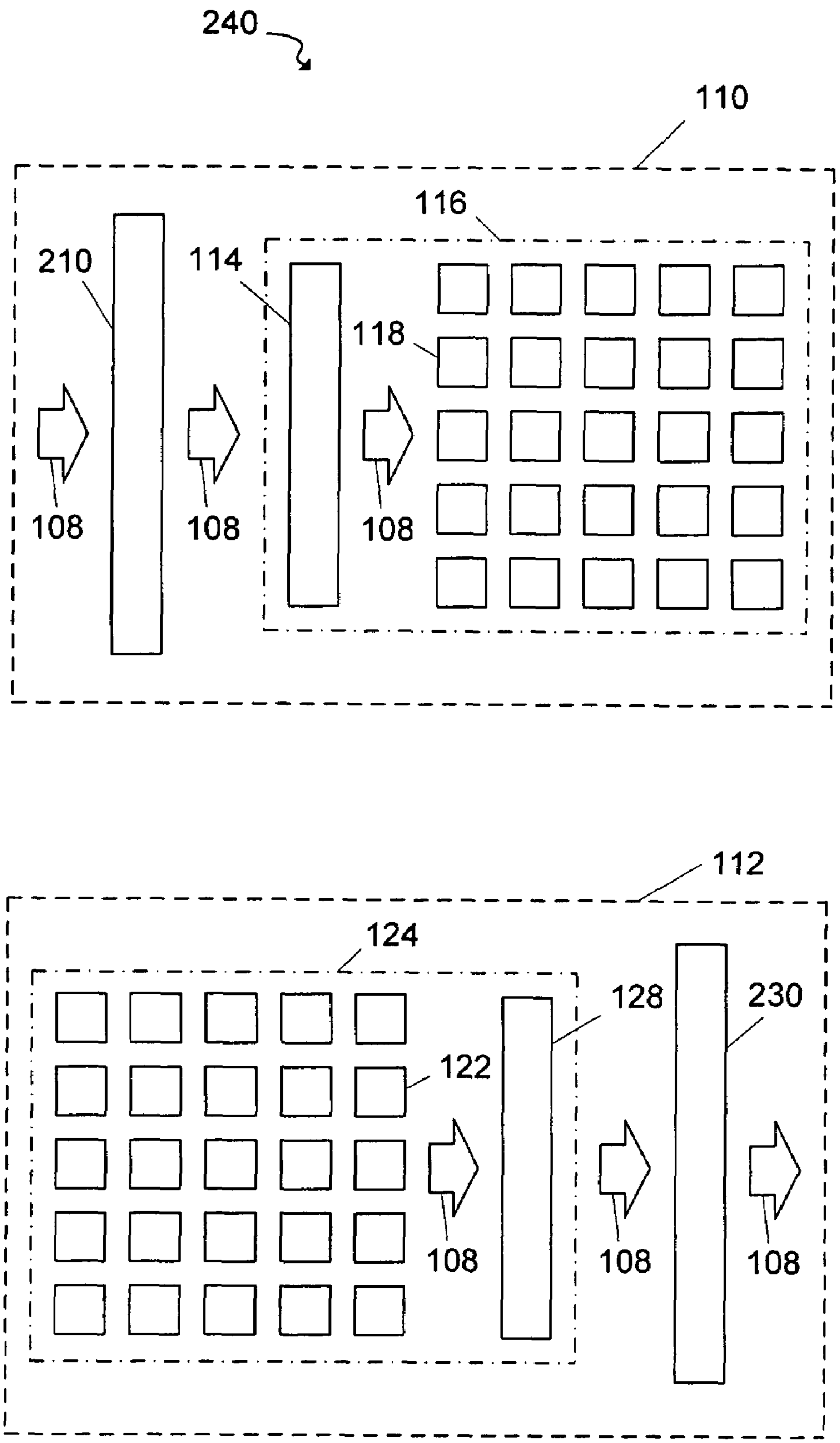
FIG. 4 illustrates the first semiconductor die with the routing mechanism external to the first array of transmitting pads in communication with the second semiconductor die with the routing mechanism external to the second array of receiving pads in an embodiment of this invention.

FIG. 4 illustrates an embodiment 240 of the present invention that facilitates capacitive communication between a first semiconductor die 110 and a second semiconductor die 112 by correction of a more coarse misalignment. The routing mechanism 210 external to the first array 116 in the first semiconductor die 110 selectively routes electrical signals to the routing mechanism 114 internal to the first array 116, and thus to at least one transmitting pad 118. The routing mechanism 230 external to the second array 124 in the second semiconductor die 112 selectively routes electrical signals from the routing mechanism 128 internal to the second array 124, and thus from at least one receiving pad 122.

In a variation on this embodiment, the first array 116 is one-dimensional and the routing mechanism 210 external to the first array 116 includes a multiplexer, having j inputs (not shown) to the multiplexer and k outputs (not shown) to the routing mechanism 114 internal to the first array 116, where j≦k. Furthermore, in this variation on this embodiment the second array 124 is one-dimensional and the routing mechanism 230 external to the second array 124 includes a multiplexer, having m inputs (not shown) to the multiplexer from the routing mechanism 128 internal to the second array 124 and n outputs (not shown), where m≧n. In a further variation, j=n and k=m.

In another variation on this embodiment, the first array 116 has two orthogonal dimensions coplanar with the surface of the first semiconductor die 110 and the routing mechanism 210 external to the first array 116 includes a multiplexer, having j inputs (not shown) to the multiplexer, k outputs (not shown) to the routing mechanism 114 internal to the first array 116 corresponding to the first direction and k outputs (not shown) to the routing mechanism 114 internal to the first array 116 corresponding to the second direction, where j≦k. Furthermore, in this variation the second array 124 has two orthogonal dimensions coplanar with the surface of the second semiconductor die 112 and the routing mechanism 230 external to the second array 124 includes a multiplexer, having m inputs (not shown) to the multiplexer from the routing mechanism 128 internal to the second array 124 corresponding to the first direction, m inputs (not shown) to the multiplexer from the routing mechanism 128 internal to the second array 124 corresponding to a second direction and n outputs (not shown), where m >n. In a further variation, j=n and k=m.

In each of the embodiments in FIGS. 2 and 4, where the first array 116 has two orthogonal dimensions coplanar with the surface of the first semiconductor die 110, the routing mechanism 114 internal to the first array 116 may have l outputs to the first array 116 in the first direction and l outputs to the first array 116 in the second direction, where l≧m.

In each of the embodiments in FIGS. 3 and 4, where the second array 124 has two orthogonal dimensions coplanar with the surface of the second semiconductor die 112, the routing mechanism 128 internal to the second array 124 may have p inputs from the second array 124 in the first direction and p inputs from the second array 124 in the second direction, where p≧k. In a further variation, l=p and m=k.

By correcting for coarse misalignment between the first semiconductor die 110 and the second semiconductor die 112 using the routing mechanism 210 external to the first array 116, the routing mechanism 230 external to the second array 124, or the routing mechanism 210 external to the first array 116 and the routing mechanism 230 external to the second array 124 capacitively coupled communication between the first semiconductor die 110 and the second semiconductor die 112 is facilitated.

Alignment Correction Using a Control Loop

Figure 5:
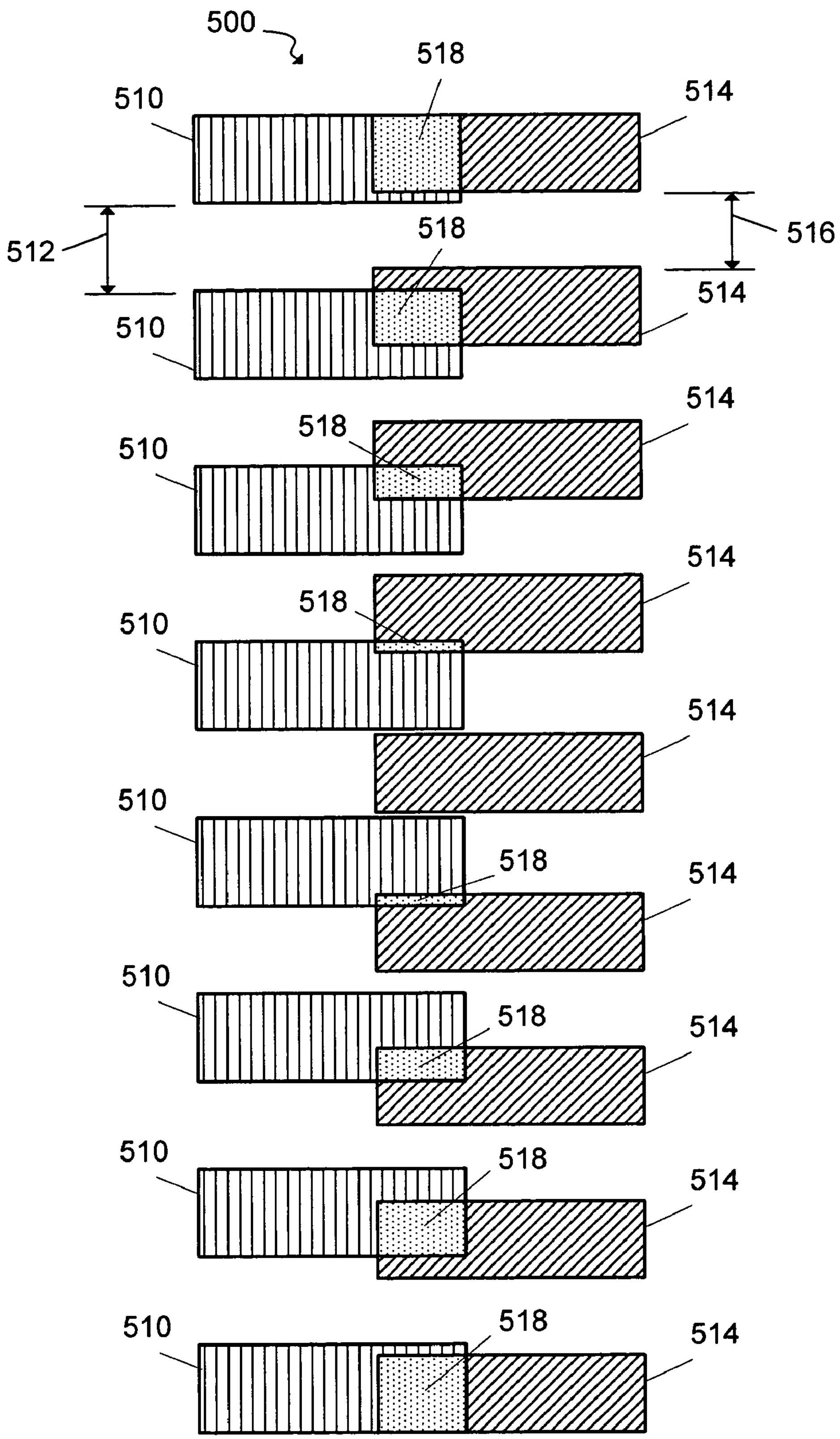
FIG. 5 illustrates a structure for determining alignment between the first semiconductor die and the second semiconductor die.

FIG. 5 illustrates a structure 500 for determining alignment between a first semiconductor die (not shown) and a second semiconductor die (not shown). The first semiconductor die contains a plurality of conducting elements 510 with a first spacing 512. The second semiconductor die contains a plurality of conducting elements 514 with a second spacing 516 different than the first spacing 512. A vernier alignment structure is formed by the overlap 518 of the conductive elements 510 and the conductive elements 514.

When the conductive elements 510 in the first semiconductor die are selectively charged using a charging mechanism (not shown), charge is induced in one or more of the conductive elements 514 in the second semiconductor die when there is overlap 518 between the conductive elements 510 and the conductive elements 514. The resulting electrical signals induced on one or more of the conductive elements 514 may be amplified using an amplification mechanism (not shown) and analyzed using an analysis mechanism (not shown) to determine the alignment between the first semiconductor die and the second semiconductor die.

Figure 6:
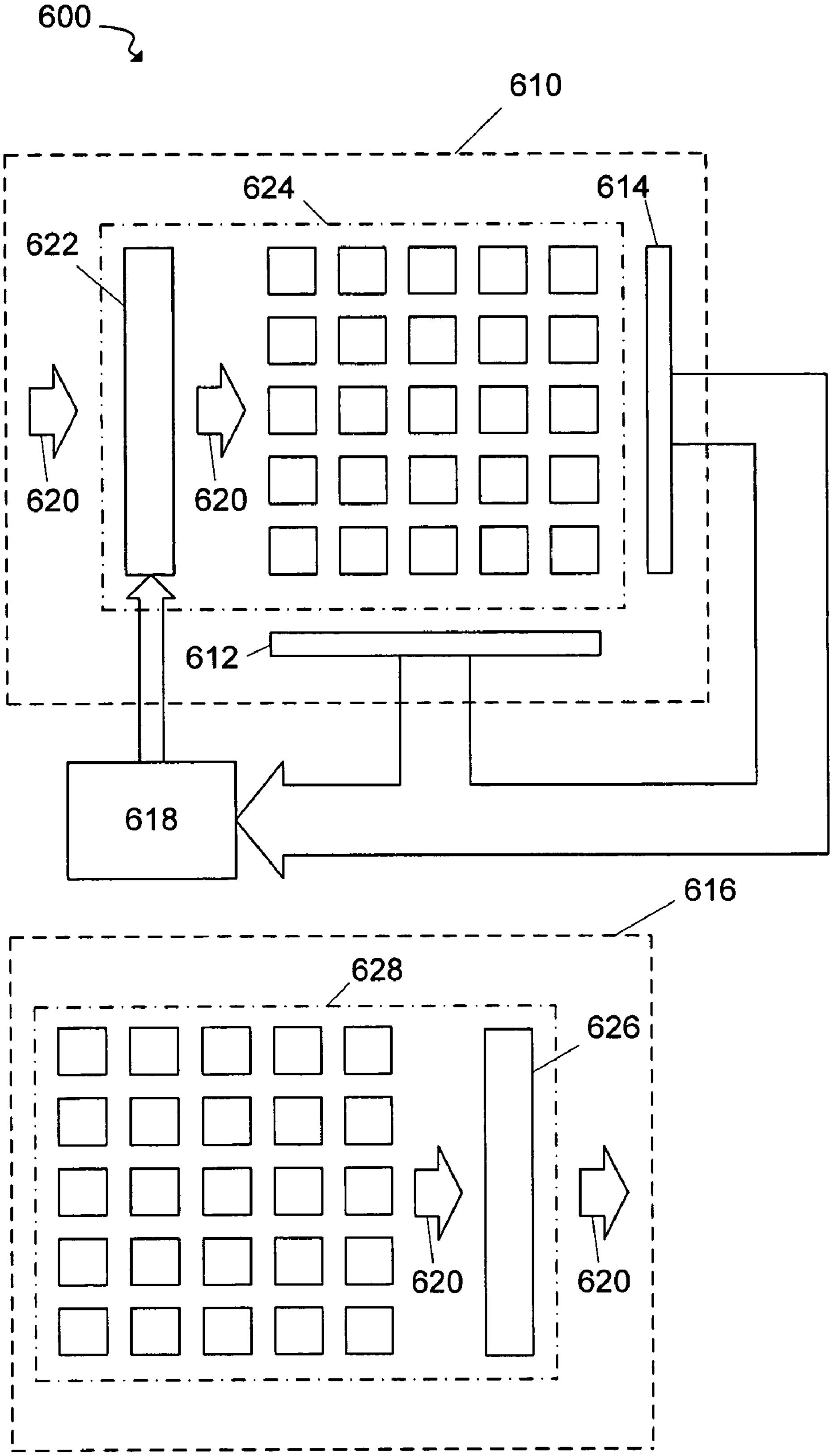
FIG. 6 illustrates a control loop for determining alignment between the first semiconductor die and the second semiconductor die and routing electrical signals to the first array and from the second array using a routing mechanism in an embodiment of the present invention.

FIG. 6 illustrates an embodiment 600 of the present invention with misalignment correction implemented as a closed-path control system. A first semiconductor die 610 contains a first vernier alignment structure 612 in a first direction and a second vernier alignment structure 614 in a second orthogonal direction. The first vernier alignment structure 612 and the second vernier alignment structure 614 are used to determine the alignment between the first semiconductor die 610 and a second semiconductor die 616 as described for the structure 500 in FIG. 5. The measured alignment is sent to a control system 618, which may be contained on the first semiconductor die 610 or may be external to the first semiconductor die 610.

Based on the measured chip alignment, the control system determines the proper routing of data 620 in the form of electrical signal using a routing mechanism 622 to at least one of the plurality of transmitting pads in a first array 624 in the first semiconductor die 610. In a variation on this embodiment, the closed-path control system may also be used to control the routing of electrical signals using a routing mechanism 626 from a second array 628 in the second semiconductor die 616. In another variation on this embodiment, the closed-path control system may route electrical signals to the first array 624 and from the second array 628 based on the alignment.

FIG. 6 illustrates the routing of the electrical signals in this embodiment with a routing mechanism 622 internal to the first array 624 such as that used in the embodiment 100 shown in FIG. 1. As noted above, in another embodiment, the electrical signals may be routed using a routing mechanism 626 internal to the second array 628 such as that used in the embodiment 100 shown in FIG. 1. In other variations on this embodiment, a routing mechanism external to the first array 624 or the second array 628 such as that used in embodiment 200 shown in FIG. 2, that used in embodiment 220 shown in FIG. 3 or that used embodiment 240 shown in FIG. 4 may be used to route the electrical signals in the closed-path control system.

In a variation on this embodiment, the determination of the alignment is performed continuously. In another variation on this embodiment, the determination of the alignment is performed periodically at times separated by an interval, where the interval is substantially fixed or substantially variable.

The closed-path control system allows correction of misalignment associated with thermal expansion and the effects of mechanical vibration, both of which may vary with time. In this way, the misalignment between the first semiconductor die 610 and the second semiconductor die 616 may be correct thereby facilitating capacitively coupled communication.

Alignment Correction Using Tiling and De-Tiling

Figure 7:
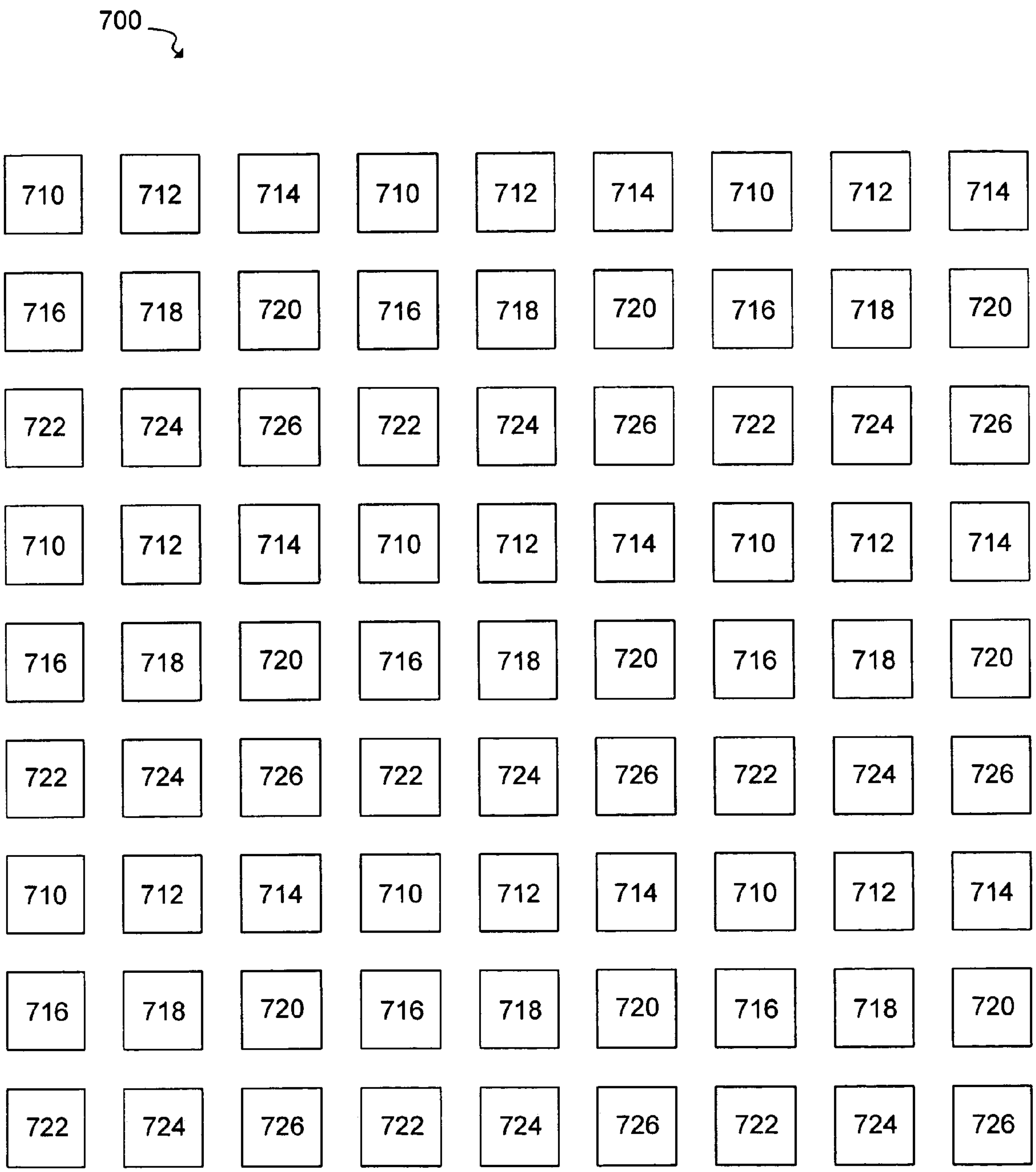
FIG. 7 illustrates spatial tiling of electrical signals corresponding to data in an embodiment of the present invention.

FIG. 7 illustrates spatial tiling 700 of electrical signals corresponding to the data 108 (shown in FIG. 1) on a plurality of interconnect pads in an array in an embodiment of this invention that allows for the correction of greater misalignment. Electrical signals 710, 712, 714, 716, 718, 720, 722, 724 and 726 are spatially repeated on the plurality of interconnect pads during at least one cycle of a clock generated by a timing mechanism. While FIG. 7 illustrates tiling in two directions of the two-dimensional array, tiling may also be performed in one direction of the two-dimensional array or in one direction of a one-dimensional array. The spatial tiling 700 illustrated in FIG. 7 facilitates the correction of misalignment up to ±1.5 interconnect pad widths (not shown) using 3 wires (as opposed to the 9 wires that would be required to facilitate the correction of this amount of misalignment).

In a variation on this embodiment, a tiling mechanism may be included in embodiments 100, 200 or 240, shown in FIG. 1, FIG. 2 and FIG. 4, respectively, spatially repeating the electrical signals on inputs to the routing mechanism 114 internal to the first array 116 in the first semiconductor die 110, and therefore spatially repeating the electrical signals on a plurality of the transmitting pads, during at least one cycle of the clock. In a one-dimensional variation on this embodiment, the electrical signals are repeated r times on s transmitting pads. In a two-dimensional variation on this embodiment, the electrical signals are repeated $r_1$ times on $s_1$ transmitting pads in the first direction and $r_2$ times on $S_2$ transmitting pads in the second direction.

In another variation on this embodiment, a de-tiling mechanism may be included in embodiments 100, 220 or 240, shown in FIG. 1, FIG. 3 and FIG. 4, respectively, for converting the spatially repeating electrical signals on a plurality of outputs from the routing mechanism 128 internal to the second array 124 in the second semiconductor die 112, and therefore spatially repeating on a plurality of the receiving pads, during at least one cycle of the clock. In a one-dimensional variation on this embodiment, the electrical signals are repeated r times on s receiving pads. In a two-dimensional variation on this embodiment, the electrical signals are repeated $r_1$ times on $s_1$ receiving pads in the first direction and $r_2$ times on $S_2$ receiving pads in the second direction.

Figure 8:
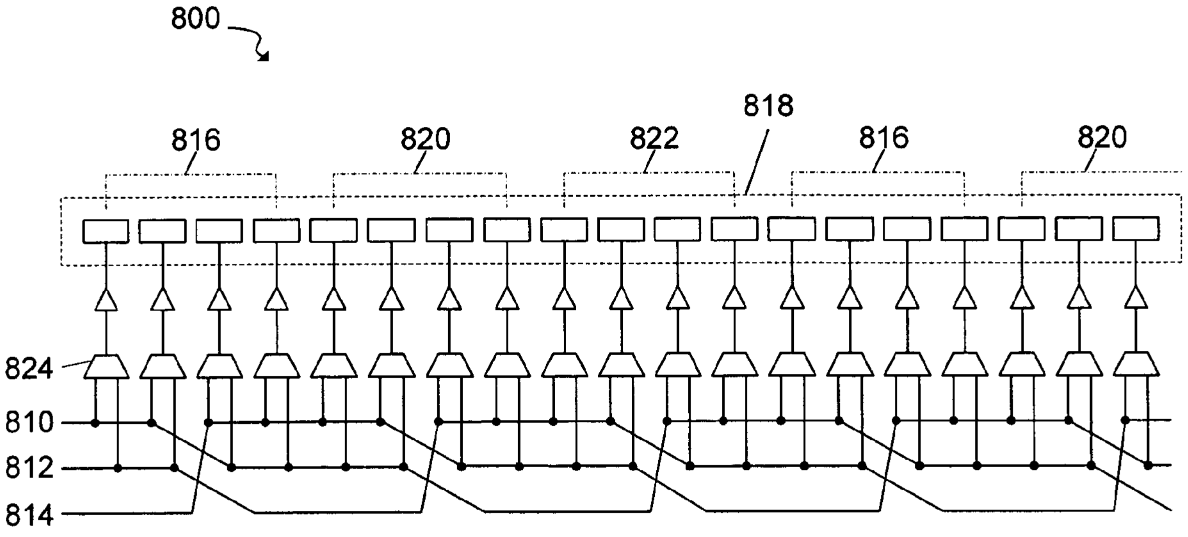
FIG. 8 illustrates an electric circuit for implementing spatial tiling of the electrical signals in an embodiment of the present invention.
Figure 9:
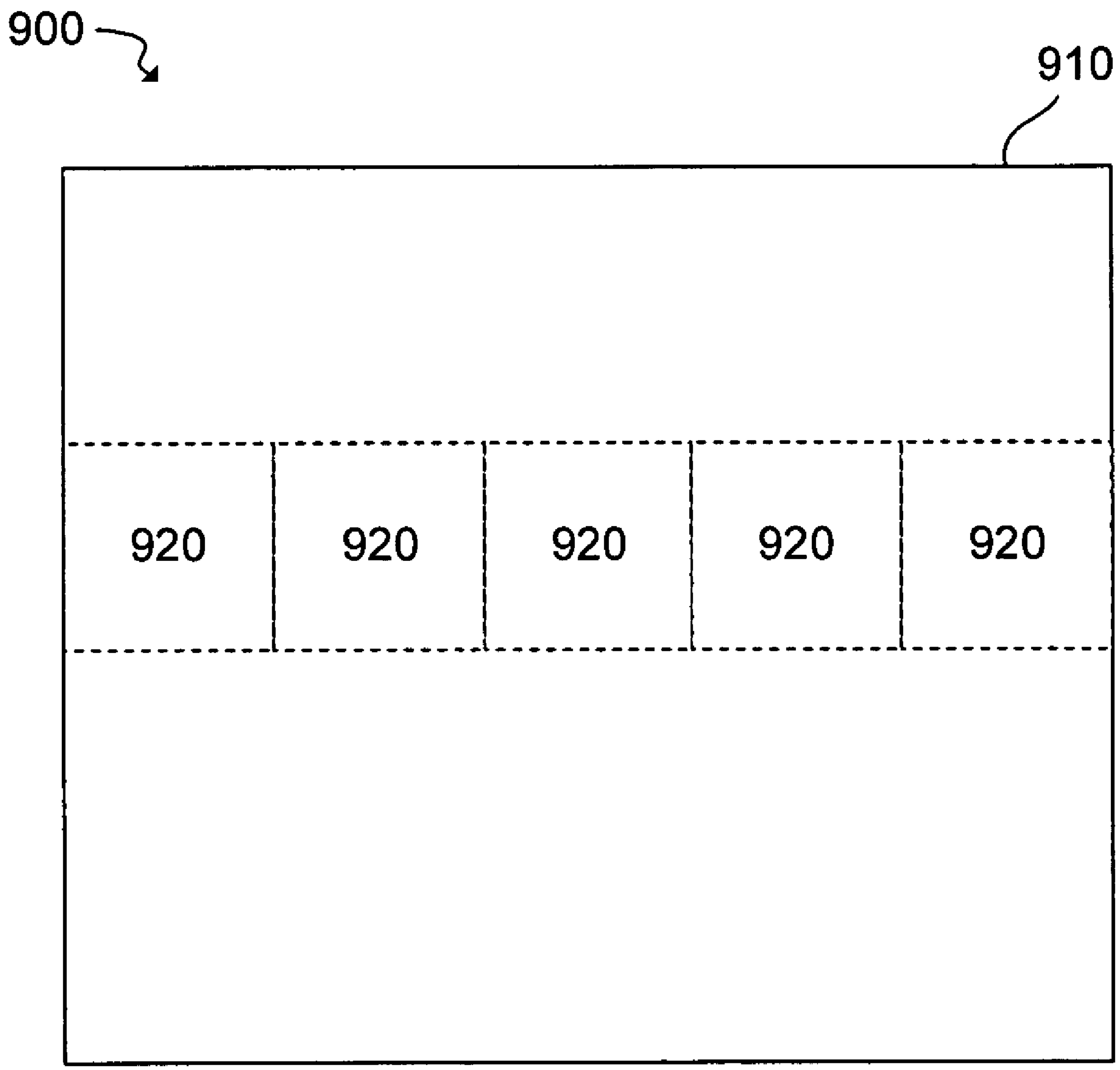
FIG. 9 illustrates spatial tiling of electrical signals corresponding to data in an embodiment of the present invention.

FIG. 8 illustrates an electronic circuit 800 with a barrel shifter for implementing spatial tiling cyclically in a direction in an embodiment of this invention. A similar electronic circuit may also be used to implement the de-tiling embodiment. FIG. 9 illustrates such cyclical tiling 900 of a block 920 in an array 910. Referring back to FIG. 8, 3 wires, 810, 812 and 814, are used as an illustrative example. The wire 810 for a first electrical signal 816 during at least one cycle of the clock is repeated once or more (once is shown) to allow farther shifting in the array of interconnect pads 818. The first electrical signal 816 is routed to appropriate interconnect pads in the array 818 using routing mechanisms, such as a multiplexer 824, thereby allowing correction of greater misalignment (up to ±1.5 interconnect pad widths (not shown)). The same is true for the third electrical signal 822 and the second electrical signal 820 on wires 812 and 814.

Without the electronic circuit 800, misalignment of half of the interconnect pad width may be corrected, unless the routing mechanism 210 (shown in FIG. 2 and FIG. 4) or the routing mechanism 230 (shown in FIG. 3 and FIG. 4) external to the array of interconnect pads 818 is used to shift the electrical signals further in the array of interconnect pads 818. The electronic circuit 800 does not require any more complexity internal to the array 818, such as multiplexing, nor any additional leads to the array 818.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for routing electrical signals between a first semiconductor die and a second semiconductor die, comprising:

determining an alignment between the first semiconductor die and the second semiconductor die; and routing the electrical signals based on the alignment, whereby the electrical signals are routed to different interconnect pads based on the alignment and thereby correcting for misalignment between the first semiconductor die and the second semiconductor die and thereby facilitating communication between the first semiconductor die and the second semiconductor die via capacitive coupling.

2. The method of claim 1, wherein the electrical signals are routed to at least one transmitting pad selected from more than one possible transmitting pad on the first semiconductor die.

3. The method of claim 1, wherein the electrical signals are routed from at least one receiving pad selected from more than one possible receiving pad on the second semiconductor die.

4. The method of claim 1, wherein the electrical signals are routed to at least one transmitting pad selected from more than one possible transmitting pad on the first semiconductor die and from at least one receiving pad selected from more than one possible receiving pad on the second semiconductor die.

5. The method of claim 1, wherein the determining an alignment is performed continuously.

6. The method of claim 1, wherein the determining an alignment is periodically performed at times separated by an interval.

7. The method of claim 6, wherein the interval is substantially fixed.

8. The method of claim 6, wherein the interval is substantially variable.

9. The method of claim 1, wherein the determining of an alignment involves using an alignment measurement mechanism comprising:

a plurality of conductive elements on the first semiconductor die and a plurality of conductive elements on the second semiconductor die, wherein the plurality of conductive elements on the second semiconductor die have a different spacing than the plurality of conductive elements on the first semiconductor die thereby forming a vernier alignment structure when the plurality of conductive elements on the first semiconductor die overlap the plurality of conductive elements on the second semiconductor die;

a charging mechanism configured to selectively charge each of the plurality of conductive elements on the first semiconductor die, wherein charging a conductive element on the first semiconductor die induces a charge in one or more conductive elements on the second semiconductor die when the conductive element on the first semiconductor die overlaps one or more conductive elements on the second semiconductor die;

an amplification mechanism configured to amplify signals induced in the conductive elements on the second semiconductor die; and an analysis mechanism configured to analyze the amplified signals to determine the alignment between the first semiconductor die and the second semiconductor die.

10. The method of claim 1, wherein the routing of the electrical signals includes a multiplexer.

11. An apparatus for communication between a first semiconductor die and a second semiconductor die, comprising:

a plurality of transmitting pads arranged in a first array on the first semiconductor die;

a plurality of receiving pads arranged in a second array on the second semiconductor die;

a routing mechanism internal to the first array, which includes a first barrel shifter; and a routing mechanism internal to the second array, which includes a second barrel shifter, whereby the routing mechanism in the first array routes electrical signals to at least one transmitting pad selected from more than one possible transmitting pad in the first array, and the routing mechanism in the second array routes electrical signals from at least one receiving pad selected from more than one possible receiving pad in the second array, thereby correcting for misalignment between the transmitting pads in the first array and the receiving pads in the second array to facilitate communication between the first semiconductor die and the second semiconductor die via capacitive coupling.

12. The apparatus of claim 11, wherein the first array is one-dimensional with a transmitting pad width, the second array is one-dimensional with a receiving pad width, the first array has a pitch defined by a distance from a center of one transmitting pad to the center of a neighboring transmitting pad and the second array has the pitch.

13. The apparatus of claim 12, wherein the routing mechanism internal to the first array and the routing mechanism internal to the second array correct for misalignment substantially less than half of the pitch.

14. The apparatus of claim 11, wherein the first array is two-dimensional, substantially coplanar with a surface of the first semiconductor die, with a transmitting pad width in a first direction and a transmitting pad width in a second direction, the second array is two-dimensional, substantially coplanar with a surface of the second semiconductor die, with a receiving pad width in the first direction and a receiving pad width in the second direction, the first array has a first pitch defined by a distance from a center of one transmitting pad to the center of a neighboring transmitting pad in the first direction, the first array has a second pitch defined by a distance from the center of one transmitting pad to the center of a neighboring transmitting pad in the second direction, and the second array has the first pitch in the first direction and the second pitch in the second direction.

15. The apparatus of claim 14, wherein the routing mechanism internal to the first array and the routing mechanism internal to the second array correct for misalignment substantially less than half of the first pitch in the first direction and substantially less than half of the second pitch in the second direction.

16. The apparatus of claim 11, further comprising a routing mechanism external to the first array configured to route electrical signals to the routing mechanism internal to the first array;

wherein the routing mechanism external to the first array corrects for coarse misalignment between the transmitting pads in the first array and the receiving pads in the second array.

17. The apparatus of claim 16, wherein the first array is one-dimensional and the routing mechanism external to the first array includes a multiplexer having n inputs to the multiplexer and m outputs to the routing mechanism internal to the first array.

18. The apparatus of claim 16, wherein the first array is two-dimensional having a first direction and a second direction both substantially coplanar with a surface of the first semiconductor die, and wherein the routing mechanism external to the first array includes a multiplexer having n inputs to the multiplexer and m outputs to the routing mechanism internal to the first array corresponding to the first direction and m outputs to the routing mechanism internal to the first array corresponding to the second direction.

19. The apparatus of claim 11, further comprising a routing mechanism external to the second array configured to route electrical signals from the routing mechanism internal to the second array;

wherein the routing mechanism external to the second array corrects for coarse misalignment between the transmitting pads in the first array and the receiving pads in the second array.

20. The apparatus configuration of claim 19, wherein the second array is one-dimensional and the routing mechanism external to the second array includes a multiplexer having m inputs from the routing mechanism internal to the second array and n outputs from the multiplexer.

21. The apparatus of claim 19, wherein the second array is two-dimensional having a first direction and a second direction both substantially coplanar with a surface of the second semiconductor die, and wherein the routing mechanism external to the second array includes a multiplexer having m inputs from the routing mechanism internal to the second array corresponding to the first direction and m inputs from the routing mechanism internal to the second array corresponding to the second direction and n outputs from the multiplexer.

22. The apparatus of claim 11, further comprising:

a routing mechanism external to the first array, whereby the routing mechanism external to the first array routes electrical signals to the routing mechanism internal to the first array, and thereby to at least one transmitting pad in the first array; and a routing mechanism external to the second array, whereby the routing mechanism external to the second array routes electrical signals from the routing mechanism internal to the second array, and thereby from at least one receiving pad in the second array, and whereby the routing mechanism external to the first array and the routing mechanism external to the second array thereby correct for coarse misalignment between the transmitting pads in the first array and the receiving pads in the second array.

23. The apparatus of claim 22, wherein the first array and the second array are one-dimensional and the routing mechanism external to the first array includes a multiplexer having j inputs to the multiplexer and k outputs to the routing mechanism internal to the first array and the routing mechanism external to the second array includes a multiplexer having m inputs from the routing mechanism internal to the second array and n outputs from the multiplexer.

24. The apparatus of claim 22, wherein the first array and the second array are two-dimensional each having a first direction and a second direction both substantially coplanar with a surface of the first semiconductor die and a surface of the second semiconductor die, and wherein the routing mechanism external to the first array includes a multiplexer having j inputs to the multiplexer and k outputs to the routing mechanism internal to the first array corresponding to the first direction and k outputs to the routing mechanism internal to the first array corresponding to the second direction, and the routing mechanism external to the second array includes a multiplexer having m inputs from the routing mechanism internal to the second array corresponding to the first direction and m inputs from the routing mechanism internal to the second array corresponding to the second direction and n outputs from the multiplexer.

25. The apparatus of claim 11, further comprising:

at least a first timing mechanism for generating a clock signal; and a tiling mechanism for converting the electrical signals into spatially repeated electrical signals on a plurality of inputs to the routing mechanism internal to the first array during at least one cycle of the clock signal, and thereby spatially repeating the electrical signals on a plurality of the transmitting pads in the first array.

26. The apparatus of claim 25, wherein the first array is one-dimensional and the spatially repeated electrical signals are spatially repeated r times on s transmitting pads in the first array.

27. The apparatus of claim 25, wherein the first array is two-dimensional with a first direction and a second direction both substantially coplanar with a surface of the first semiconductor die, and the spatially repeated electrical signals are spatially repeated $r_1$ times on $s_1$ transmitting pads in the first direction, and the spatially repeated electrical signals are spatially repeated $r_2$ times on $s_2$ transmitting pads in the second direction.

28. The apparatus of claim 25, further comprising a de-tiling mechanism for converting spatially repeated electrical signals that are spatially repeated on a plurality of outputs from the routing mechanism internal to the second array, and therefore spatially repeated on a plurality of the receiving pads in the second array, into the electrical signals during at least one cycle of the clock signal.

29. The apparatus configuration of claim 28, wherein the second array is one-dimensional and the spatially repeated electrical signals are spatially repeated r times on s receiving pads in the second array.

30. The apparatus of claim 28, wherein the second array is two-dimensional with a first direction and a second direction both substantially coplanar with a surface of the second semiconductor die, and the spatially repeated electrical signals are spatially repeated $r_1$ times on $s_1$ receiving pads in the first direction, and the spatially repeated electrical signals are spatially repeated $r_2$ times on $s_2$ receiving pads in the second direction.

* * * * *

UNITED STATES PATENT AND TRADEMARK OFFICE

CERTIFICATE OF CORRECTION

PATENT NO. : 7,200,830 B2 
APPLICATION NO. : 10/879607
DATED : June 28, 2004
INVENTOR(S) : Robert J. Drost et al.

It is certified that error appears in the above-identified patent and that said Letters Patent is hereby corrected as shown below:

In claim 5 (at column 10, line 25), please insert the word --of-- between the words "determining" and "an."

In claim 6 (at column 10, line 37), please insert the word --of-- between the words "determining" and "an."

In claim 29 (at column 14, line 13), please delete the word "configuration."

Signed and Sealed this

Fifth Day of June, 2007

JON W. DUDAS
*Director of the United States Patent and Trademark Office*

UNITED STATES PATENT AND TRADEMARK OFFICE

CERTIFICATE OF CORRECTION

PATENT NO. : 7,200,830 B2
APPLICATION NO. : 10/879607
DATED : April 3, 2007
INVENTOR(S) : Robert J. Drost et al.

It is certified that error appears in the above-identified patent and that said Letters Patent is hereby corrected as shown below:

In claim 5 (at column 10, line 25), please insert the word --of-- between the words "determining" and "an."

In claim 6 (at column 10, line 37), please insert the word --of-- between the words "determining" and "an."

In claim 29 (at column 14, line 13), please delete the word "configuration."

This certificate supersedes Certificate of Correction issued June 5, 2007.

Signed and Sealed this

Third Day of July, 2007

JON W. DUDAS
*Director of the United States Patent and Trademark Office*